United States Patent
Dixit et al.

(10) Patent No.: US 7,117,408 B2
(45) Date of Patent: Oct. 3, 2006

(54) METHOD AND SYSTEM OF TESTING DATA RETENTION OF MEMORY

(75) Inventors: Charutosh Dixit, Mountain View, CA (US); William Shen, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 465 days.

(21) Appl. No.: 10/614,642

(22) Filed: Jul. 7, 2003

(65) Prior Publication Data

US 2004/0165415 A1   Aug. 26, 2004

Related U.S. Application Data

(60) Provisional application No. 60/450,604, filed on Feb. 26, 2003.

(51) Int. Cl.
*G11C 29/00* (2006.01)
*G11C 7/00* (2006.01)

(52) U.S. Cl. .................. 714/720; 714/700; 365/201

(58) Field of Classification Search ........ 714/718–723, 714/700, 731, 744, 707, 798; 365/200–201
See application file for complete search history.

(56) References Cited

U.S. PATENT DOCUMENTS

| 5,577,050 A * | 11/1996 | Bair et al. ............. 714/710 |
| 5,835,429 A * | 11/1998 | Schwarz ............... 365/201 |
| 6,255,836 B1 * | 7/2001 | Schwarz et al. ........ 324/763 |
| 6,272,588 B1 * | 8/2001 | Johnston et al. ....... 711/106 |
| 6,496,947 B1 * | 12/2002 | Schwarz ............... 714/30 |
| 6,681,350 B1 * | 1/2004 | Adams et al. .......... 714/718 |
| 6,697,978 B1 * | 2/2004 | Bear et al. ............ 714/718 |
| 7,064,998 B1 * | 6/2006 | Nakamura et al. ...... 365/222 |

FOREIGN PATENT DOCUMENTS

JP    11149798 A  *  6/1999

OTHER PUBLICATIONS

"An Efficient BIST Method for Testing of Embedded SRAMs" by Tehranipour et al. International Symposium on Circuits and Systems, 2001 Publication Date: 2001 vol. 5, pp. 73-76 ISBN: 0-7803-6685-9INSPEC Accession No. 7042567.*

"Quick Address Detection of Anomalous Memory Cells in a Flash Memory Test Structure" by Himeno,et al. IEEE Transactions on Semiconductor Manufacturing, Publication Date: May 1997 vol. 10, Issue: 2 pages: 196-200 INSPEC Accession No. 5570257.*

* cited by examiner

*Primary Examiner*—Cynthia Britt
(74) *Attorney, Agent, or Firm*—Conley Rose, P.C.

(57) ABSTRACT

A method and system of testing data retention of memory is provided. An embodiment of the method of testing data retention of memory comprises: writing first data to a first memory sub-group during a first time period; writing second data to a second memory sub-group during a second time period subsequent to said first time period; pausing for a predetermined time interval during a third time period subsequent to said second time period; reading a first one of said first and second data during a fourth time period subsequent to said third time period; reading a second one of said first and second data during a fifth time period subsequent to said fourth time period; and comparing said first and second ones of read data to expected results to determine data retention capabilities of said first and second memory sub-groups.

25 Claims, 2 Drawing Sheets

METHOD AND SYSTEM OF TESTING DATA RETENTION OF MEMORY

CROSS-REFERENCE TO RELATED APPLICATIONS

The present application claims priority from U.S. Provisional Application No. 60/450,604 filed on Feb. 26, 2003.

TECHNICAL FIELD OF THE INVENTION

The present invention is directed, in general, to testing memory data retention and, more specifically, to a system and method for testing data retention of memory while managing power consumption, waiting periods and associated costs of testing.

BACKGROUND OF THE INVENTION

Advances in fabrication techniques and other areas of integrated circuit technology continue to decrease the size of on-chip memory. Consequently, designers are taking advantage of a rapid increase in the packing density of memory cells. Accordingly, as much as 10–20 Mbits of memory may presently be formed on a single chip and there is every reason to believe the amount of memory will continue to increase.

Although generally a positive development, the increased packing density of memory cells, and increasing memory capacity resulting therefrom, is accompanied by increased testing time and corresponding costs. For example, quality control standards often mandate that most if not all of the memory cells in a particular manufacturing lot or chip be tested. As such, the increased packing density generally increases the length and costs of the testing phase of manufacturing for each chip fabricated.

For example, an important part of quality control in the manufacture of on-chip memory is data retention testing, which determines the ability of memory cells to retain their data content over a relatively long period of time. The inability of memory cells to retain data may point to a manufacturing defect. Existing data retention testing techniques typically include writing data to a memory cell or group and subsequently reading the memory after a predetermined waiting period. The waiting period is generally much longer than memory access times for an effective test. For example, the waiting period typically ranges between about 500 ms and about 1 second, whereas read and write speeds can be performed at speeds ranging, for example, between about 20 and about 50 MHz. It follows that the increase in the number of memory cells on a chip can increase the time and corresponding costs required for data retention testing of all or a portion of the memory cells.

Accordingly, in an effort to keep the total test time to a minimum, existing data retention testing techniques typically include simultaneously writing to all of the memory cells on a chip, simultaneously holding all of the cells in one waiting period, and simultaneously reading data from all of the cells for comparison to expected values. By holding all of the memory cells on a chip in the waiting period simultaneously, only one waiting period is required for testing of each chip, thereby minimizing the total testing time. However, the simultaneous access of the large number of memory cells presents issues of power consumption management during testing, as described below.

One such power management issue regards peak power. That is, the simultaneous access of a large number of cells requires a significant demand on current and power during a short time period, which can damage chip components not necessarily designed for such increased current and power levels. Another power management issue regards average power. Generally, the average power consumption during existing memory testing techniques may be greater than desired, which can cause thermal degradation of various components and power supply voltage drop problems. Further, designing the chip to handle such peak and average power issues during testing may consume unnecessary resources on the chip since these issues may rarely, if ever, arise during normal operation.

One attempt at overcoming these power management issues has been to partition the memory being tested such that only portions of the memory cells on a chip are written to or read from at a time. In such an arrangement, data is written to a group of memory cells, the conventional waiting period is performed, data is read from the cells, and the process is repeated for each remaining group of cells. While such an approach may mitigate the power management issues discussed above, it requires the inclusion of a waiting period for each group of cells that are tested, thereby increasing the total test time required to effectively verify the data retention capabilities of all of the memory cells on a chip. As discussed above, it is desirable that this total test time be minimized to streamline fabrication and reduce costs.

Consequently, there is a need in the art to address these competing interests in effectively managing power consumption and minimizing total testing time and costs.

SUMMARY OF THE INVENTION

A method and system of testing data retention of memory is provided. An embodiment of the method of testing data retention of memory comprises: writing first data to a first memory sub-group during a first time period; writing second data to a second memory sub-group during a second time period subsequent to said first time period; pausing for a predetermined time interval during a third time period subsequent to said second time period; reading a first one of said first and second data during a fourth time period subsequent to said third time period; reading a second one of said first and second data during a fifth time period subsequent to said fourth time period; and comparing said first and second ones of read data to expected results to determine data retention capabilities of said first and second memory sub-groups. By only writing to sub-groups of memory instead of simultaneously writing to all of the memory, the power management issues discussed above may be addressed. Moreover, by writing to all of the memory sub-groups before pausing for the predetermined time interval or reading from the memory, the total test time required may also be significantly decreased compared to conventional data retention testing techniques.

Similar advantages may be achieved with a system for testing memory sub-groups as disclosed herein. An embodiment of a system of testing data retention of memory comprises: a plurality of memory controllers each associated with and configured to access at least one memory sub-group; a test controller configured to enable said memory controllers to: write to said associated memory sub-groups during a plurality of first time periods that are each distinct to one of said memory controllers, pause for a predetermined time interval during a second time period that is subsequent to said first time periods, and read from said associated memory sub-groups during a plurality of third time periods that are each distinct to one of said memory controllers and subsequent to said second time period; and a comparison device configured to compare data read from said memory sub-groups to expected results to determine data retention capabilities of said memory sub-groups.

Another embodiment of a system of testing data retention of memory comprises: means for accessing sub-groups of memory; means for controlling said accessing means to: write data to said memory sub-groups during a plurality of distinct first time periods, pause for a predetermined time interval during a second time period that is subsequent to said first time periods, and read data from said memory sub-groups during a plurality of distinct third time periods that are subsequent to said second time period; and means for comparing said read data to expected results to determine data retention capabilities of said memory sub-groups.

The foregoing has outlined preferred and alternative features of the present invention so that those skilled in the art may better understand the detailed description that follows. Those skilled in the art should appreciate that they can readily use the present disclosure as a basis for designing or modifying other structures for carrying out the same purposes and/or achieving the same advantages described in the present disclosure. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying FIGS, in which.

NOTATION AND NOMENCLATURE

Certain terms are used throughout the following description and claims to refer to particular system components. As one skilled in the art will appreciate, components may be referred to by different names. This document does not intend to distinguish between components that differ in name, but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical or communicative connection. Thus, if a first device couples to a second device, that connection may be through a direct connection, or through an indirect connection via other devices and connections.

DETAILED DESCRIPTION

The following discussion is directed to various embodiments of the invention. Unless otherwise specified, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment. In this disclosure, numerous specific details may be set forth to provide a sufficient understanding of the embodiment. However, those skilled in the art will appreciate that the invention may be practiced without such specific details. In other instances, well-known elements may have been illustrated in schematic or block diagram form in order not to obscure the disclosure in unnecessary detail. Additionally, some details may have been omitted inasmuch as such details were not considered necessary to obtain a complete understanding of the embodiment, and are considered to be within the understanding of persons of ordinary skill in the relevant art. It is further noted that all functions described herein may be performed in either hardware or software, or a combination thereof, unless indicated otherwise.

Figure 1:
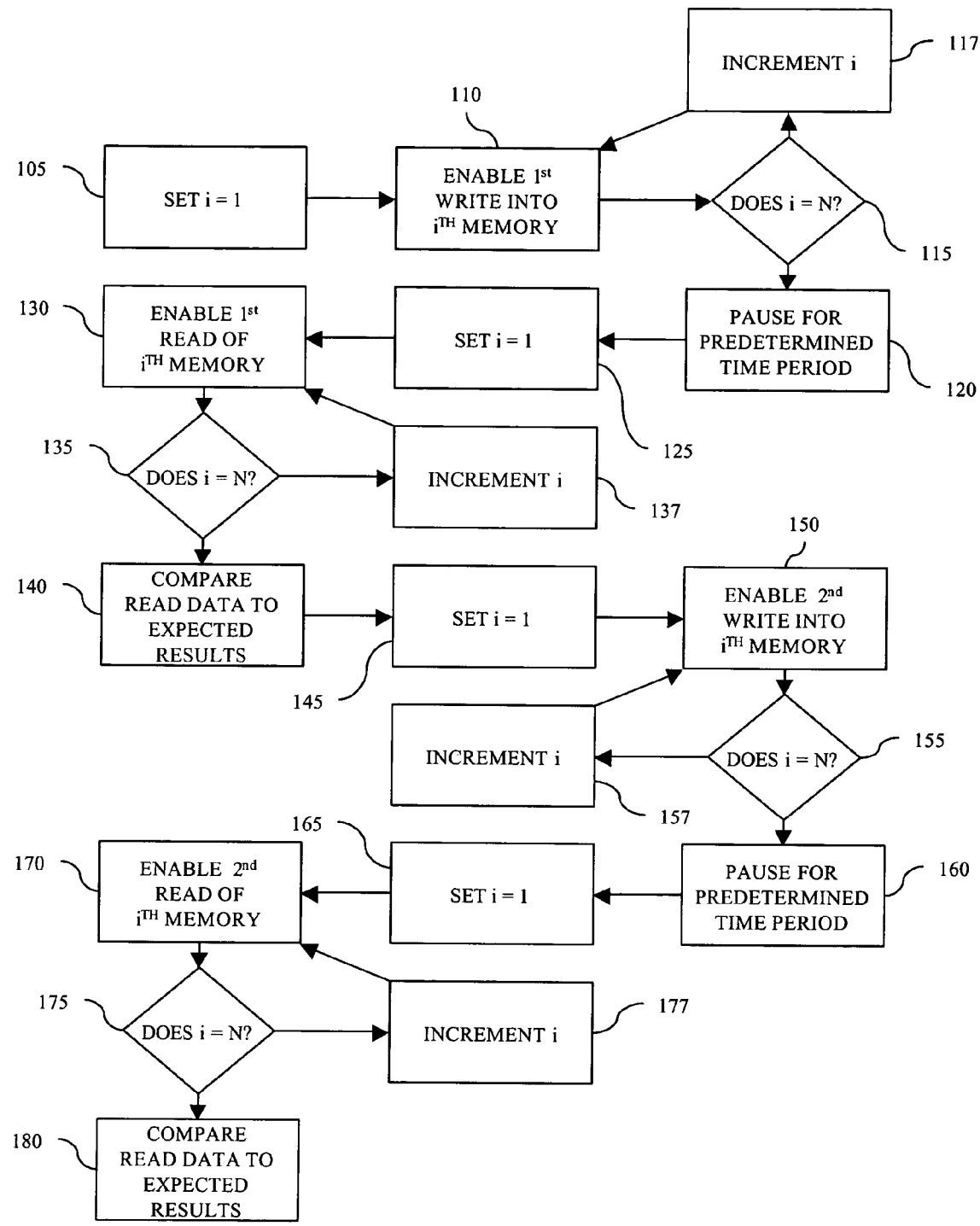
FIG. 1 illustrates a flow-chart of an embodiment of a method of testing memory data retention.

Referring initially to FIG. 1, illustrated is a flow-chart of one embodiment of a method 100 of testing memory data retention. The memory on a particular chip being tested may be partitioned into memory sub-groups. However, the manner in which the memory is partitioned and the resulting number of memory sub-groups is not limited by the scope of the present disclosure. Accordingly, the present disclosure will assume there are a number N of memory sub-groups being tested. Of course, it is also not necessary that the N memory sub-groups comprise the entire array of memory on the chip being tested.

The method 100 begins at a step 105 by setting an iterating variable "i" to an initial value of 1. In a next step 110, data is written to the memories in the $i^{th}$ memory sub-group. In one embodiment, the data written to the memories in the $i^{th}$ memory sub-group may be in a checkerboard pattern (e.g., 101010 . . . ), although the data may be written in any suitable or desired pattern.

In a subsequent decisional step 115, the value of the iterating variable i is compared to the number N of memory sub-groups being tested. If the value of the iterating variable i is less than the number N, the method 100 proceeds to an iterating step 117 in which the iterating variable i is incremented (typically by adding the value 1 to its current value). The method 100 then returns to the writing step 110 to write data to the memories in the next memory sub-group. This first iterative writing portion of the method 100 continues until data is written to all of the N memory sub-groups being tested. Identical data may be written to each memory sub-group, although the data may also vary among the memory sub-groups, such as may be required if the memory sub-groups vary in size, construction or function.

By writing to the N memory sub-groups with the iterative data-writing process described above, the power management issues of the prior art may be avoided. That is, the method 100 includes writing first data to a first memory sub-group during a first time period, writing second data to a second memory sub-group during a second time period that is subsequent to the first time period, and so on, until $N^{th}$ data is written to an $N^{th}$ memory sub-group during an $N^{th}$ time period subsequent to all previous data-writing time periods. As such, current and power levels during the data-writing time periods may be limited to those levels required to access the memory sub-groups. Accordingly, current and power levels may be kept under a desired maximum by dividing the on-chip memory into the appropriate number of memory sub-groups. In contrast, conventional data retention testing methods which include simultaneously writing to all of the memory require much higher current and power levels because data is written to a very large number of cells during a single, relatively short time period. Accordingly, the thermal problems and voltage drop issues conventionally stemming from simultaneously accessing all of the memory may be mitigated or eliminated by employing the method 100 disclosed herein. Moreover, because access speeds of existing and future-developed memory devices are relatively fast, the impact on total test time required for data retention testing may be insubstantial despite the additional data-writing time periods.

Once data is written to all of the N memory sub-groups being tested, as determined by the decisional step 115, the method 100 proceeds to a pause step 120 in which the data is held in the N memory sub-groups for a predetermined time interval during a waiting period. The predetermined length of the waiting period in the pause step 120 typically ranges between about 500 ms and 1 second, although other time intervals may be employed. Moreover, some applications may not require the pause step 120. For example, the number N of memory sub-groups being tested may be large enough that the total time required to write to the N memory sub-groups may comprise a sufficient waiting period to effectively determine the data retention capabilities of the N memory sub-groups. In such applications, the method 100 may proceed directly from the decisional step 115 to a next step 125.

After data is written to the N memory sub-groups by the iterative writing process described above and the waiting period is employed, if necessary, the method 100 proceeds in a step 125 by again setting the iterating variable i to the value 1. In a next step 130, data is read from the memories in the $i^{th}$ memory sub-group. In a subsequent decisional step 135, the value of the iterating variable i is compared to the number N of memory sub-groups being tested. If the value of the iterating variable i is less than the number N, the method 100 proceeds to an iterating step 137 in which the iterating variable i is incremented. The method 100 then returns to the reading step 130 to read data from the memories in the next memory sub-group. This iterative read process continues until the N memory sub-groups being tested are read. By reading data from the N memory sub-groups by the iterative process described above, the power management issues of the prior art may once again be avoided, because fewer memory cells may be accessed during any one time period.

Data may be read from the N memory sub-groups in the same sequence in which data was written to the N memory sub-groups. However, the particular sequence in which data is written to and read from the N memory sub-groups is not limited by the present disclosure, and the data-reading sequence may or may not be the same as the data-writing sequence.

Once the data is read from the N memory sub-groups being tested, the data is compared to expected values in a comparison step 140 to determine the data retention capabilities of the N memory sub-groups. The degree of correlation between the read data and expected values necessary to accurately indicate effective data retention may vary among the various applications in which the present data retention testing method 100 may be employed. Accordingly, the specific method employed to compare the read data and expected values is not limited by the present disclosure.

In one embodiment, the method 100 may be substantially completed by the comparison step 140. However, a more comprehensive characterization of the data retention capabilities of the N memory sub-groups may be achieved by repeating the iterative writing and reading processes described above.

Accordingly, the data retention testing method 100 may include a second iterative writing process beginning at step 145, in which the value of the iterating variable i may once again be set to 1. In a second writing step 150, data may again be written to the $i^{th}$ memory sub-group. As with the first writing step 110, the data written to the $i^{th}$ memory sub-group may be in a checkerboard pattern. In one embodiment, the data written during the second writing step 150 may have a pattern that is the inverse of the pattern of the data written during the first writing step 110. For example, the data written in the first writing step 110 may have a checkerboard pattern (e.g., 101010 . . . ) and the data written in the second writing step 150 may have an inverse checkerboard pattern (e.g., 010101 . . . ). However, the data written to the N memory sub-groups in the first and second writing steps 110 and 150 are not limited to any particular pattern(s).

In a subsequent decisional step 155, the value of the iterating variable i is compared to the number N of memory sub-groups being tested. If the value of the iterating variable i is less than the number N, the method 100 proceeds to an iterating step 157 in which the iterating variable i is incremented. The method 100 then returns to the writing step 150 to write data to the next memory sub-group. This second iterative writing portion of the method 100 continues until data is written to the N memory sub-groups being tested.

Once data is again written to all of the N memory sub-groups being tested, as determined by the decisional step 155, the method 100 proceeds to a pause step 160 in which the data is held in the N memory sub-groups for a predetermined time interval during a waiting period. The second pause step 160 may be substantially similar to the first pause step 120. For example, the predetermined length of the waiting period in the pause step 160 may range between about 500 ms and 1 second. Of course, other time intervals may be employed for the pause step 160. Moreover, as discussed above with respect to the first pause step 120, some applications may not require the second pause step 160, such that the method 100 may proceed directly from the decisional step 155 to a next step 165.

After data is written to the N memory sub-groups by the second iterative writing process described above and the waiting period is employed, if necessary, the method 100 proceeds in a step 165 by once again setting the value of the iterating variable i to 1. In a next step 170, data is read from the $i^{th}$ memory sub-group. In a subsequent decisional step 175, the value of the iterating variable i is compared to the number N of memory sub-groups being tested. If the value of the iterating variable i is less than the number N, the method 100 proceeds to an iterating step 177 in which the iterating variable i is incremented. The method 100 then returns to the second reading step 170 to read data from the next memory sub-group. This iterative read process continues until data is read from all of the N memory sub-groups being tested.

Once data is read from the N memory sub-groups being tested, the data is compared to expected values in a second comparison step 180 to further determine the data retention capabilities of the N memory sub-groups. As with the first comparison step 140 discussed above, any suitable method may be employed to compare the read data to expected results.

As discussed above, accessing memory sub-groups individually instead of simultaneously accessing all of the memory being tested may mitigate or eliminate the thermal degradation and voltage drop issues of conventional testing protocols. Moreover, the improved power management of the data retention testing method 100 may be achieved with little impact on the total test time required to effectively determine the data retention capabilities of the memory sub-groups being tested. That is, while the number of writing and reading steps in the present data retention testing method may be increased compared to conventional methods, the number of waiting periods between the writing and reading processes does not experience a corresponding increase. In fact, the method 100 may incorporate only one or two waiting periods, and may not incorporate any waiting periods. As discussed above, the waiting portion of conventional data retention testing methods accounts for the largest portion of the total test time. By employing a limited number of waiting periods in accord with the present disclosure, the total data retention testing time of the memory may be maintained at a minimum. Moreover, although additional writing and reading steps may be employed in the presently disclosed data retention testing method compared to conventional methods, the additional writing and reading processes have minimal impact on the total test time because memory access times are typically much shorter than the waiting period(s).

Figure 2:
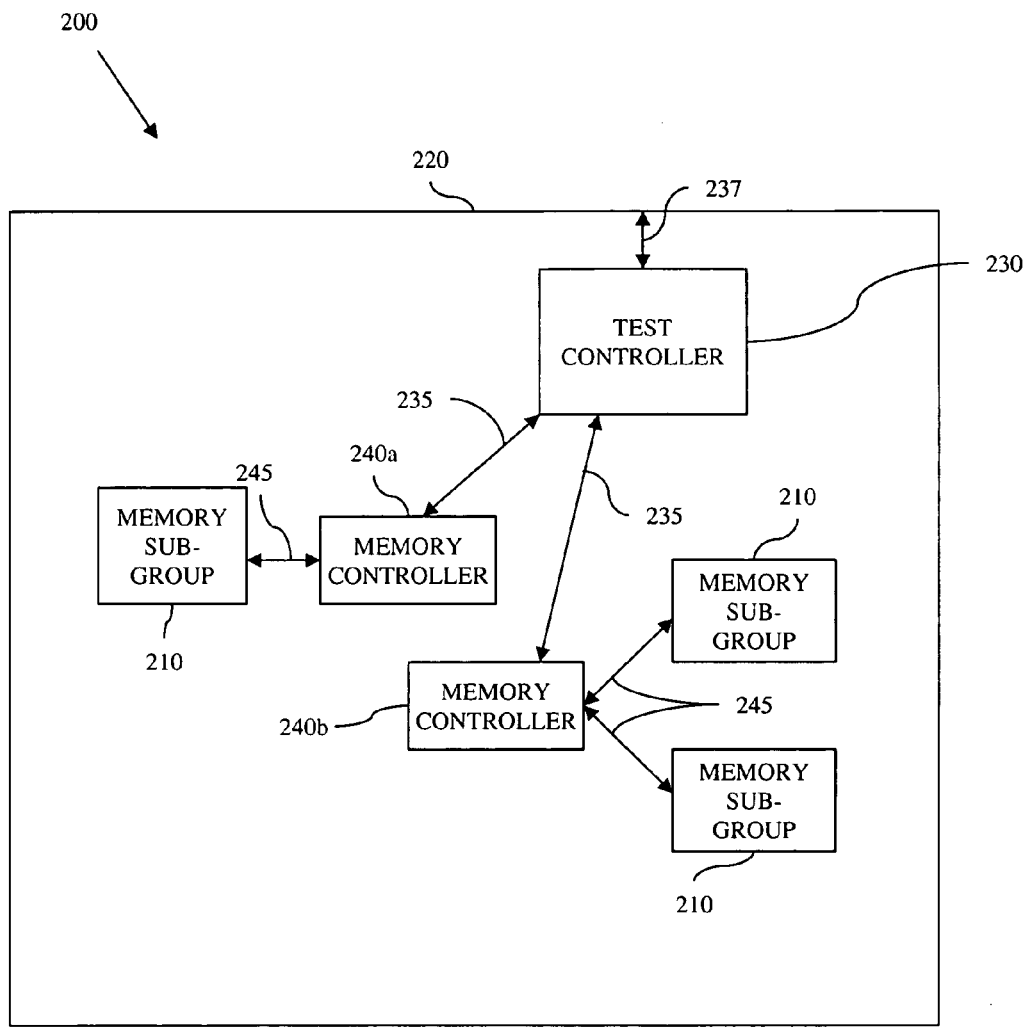
FIG. 2 illustrates a block diagram of an embodiment of a system for testing data retention of memory sub-groups constructed.

Turning to FIG. 2, with continued reference to the method 100 illustrated in FIG. 1, illustrated is a block diagram of one embodiment of a system 200 for testing memory sub-groups 210. The system 200 may be one environment in which the data retention testing method 100 discussed above may be implemented. As illustrated in FIG. 2, the system 200 may be built into or otherwise included on a chip 220 that includes a test controller 230 coupled to memory controllers 240a and 240b which are in turn coupled to memory sub-groups 210. However, the system 200 shown in FIG. 2 is intended to merely demonstrate the possible components thereof. Accordingly, the layout of the system 200, the chip 220 and their components is not limited to the embodiment illustrated in FIG. 2. For example, while the system 200 and memory sub-groups 210 are shown in FIG. 2 as integral to the chip 220, the system 200 and memory sub-groups 210 maybe located on separate chips.

In the embodiment shown, the memory controller 240a is dedicated to a single memory sub-group 210, whereas the memory controller 240b is shared by multiple memory sub-groups 210. However, the function of the memory controllers 240a and 240b within the scope of the present disclosure may be substantially similar. Accordingly, the memory controllers 240a and 240b, whether shared or dedicated, may be collectively referred to hereafter as the memory controllers 240.

The memory controllers 240 may comprise built-in self-test (BIST) controllers. In general, the BIST controllers or other memory control means 240 may each be associated with one or more memory sub-groups 210, and may be configured to write data to and read data from the associated memory sub-groups 210, as indicated by the arrows 245. Also memory subgroups may comprise of one or many controllers. Those skilled in the art are familiar with BIST controllers and will understand that the memory controllers 240 may comprise additional and/or alternative components for dedicated and/or shared access of the associated memory sub-groups 210.

The test controller 230 may comprise a test access port (TAP) controller. For example, the test controller 230 may comprise one or more commercially available boundary-scan IEEE 1149.1 TAP controllers, such as those available from JTAG Technologies in Stevensville, Md. In general, the TAP controller or other test control means 230 may be configured to enable the memory controllers 240 to access associated memory sub-groups 210, as indicated by the arrows 235. Moreover, the test controller 230 may be configured to enable the memory controllers 240 in accord with the method 100 discussed above. For example, the test controller 230 may be configured to enable the memory controllers 240 to write data to the memory sub-groups 210 during distinct first time periods and subsequently read data from the memory sub-groups 210 during distinct second time periods. Those skilled in the art are familiar with TAP controllers and other types of memory access control, and will understand that the test controller 230 may comprise controller components in addition to and/or instead of a TAP controller for enabling the memory controllers 240 to access the memory sub-groups 210.

The configuration of the test controller 230 to enable the memory controllers 240 may be hardwired within the test controller 230 or may be achieved by other predetermined design considerations. The configuration of the test controller 230 may also be achieved by communication with components exterior to the system 200 and/or chip 220, as indicated by the arrows 237.

Each of the distinct first and second time periods may be exclusive to a dedicated or shared memory controllers 240. That is, a number N of memory sub-groups 210 may be individually written to by N or fewer memory controllers 240 during N or fewer first time periods and individually read during N or fewer second time periods. As such, current and power levels during any time period may be maintained under desired thresholds to avoid the thermal degradation and voltage problems associated with conventional data retention testing systems.

The test controller 230 may also be configured to compare the data read from the memory sub-groups 210 to expected results to facilitate the determination of the data retention capabilities of the memory sub-groups 210. However, additional and/or alternative components included in or exterior to the system 200 and chip 220 may also or alternatively be employed for such comparison.

In one embodiment, the test controller 230 may be configured to enable the memory controllers 240 to write data to the memory sub-groups 210 in a predetermined pattern. For example, the memory controllers 240 may write data to the memory sub-groups 210 in a checkerboard pattern. The test controller 230 may also be configured to enable the memory controllers 240 to perform a second write to the memory sub-groups 210 after data initially written to the memory sub-groups 210 has been read. Moreover, the test controller 230 may be configured to enable the memory controllers 240 to write data to the memory sub-groups 210 in a second pattern that is different from the first data pattern. For example, the first data pattern may be a checkerboard pattern and the second pattern may be an inverse checkerboard pattern.

Thus, the present disclosure provides a method 100 and system 200 for testing data retention of memory. By employing the method 100 and/or system 200, current and power levels during memory access periods may be sufficiently controlled to decrease or prevent thermal degradation of associated components and mitigate or eliminate power and voltage drop issues. Moreover, the method 100 and system 200 may be employed without significant impact to total data retention testing time, thereby contributing to the effective control of manufacturing costs.

The above discussion is meant to be illustrative of the principles and various embodiments of the present invention. Numerous variations and modifications will become apparent to those skilled in the art once the above disclosure is fully appreciated. For example, the system and method for testing data retention of memory may at times incorporate more or less components or functions than the embodiments described herein. This disclosure makes those principles and modified embodiments apparent to those skilled in the art. It is intended that the following claims be interpreted to embrace all such variations and modifications.

What is claimed is:

1. A method of testing data retention of a memory, comprising:
    writing first data to a first memory sub-group during a first time period;
    writing second data to a second memory sub-group during a second time period subsequent to said first time period;
    pausing for a predetermined time interval during a third time period subsequent to said second time period if the total time required to write said first data to said first memory sub-group and said second data to said second memory sub-group is insufficient to determine data retention capabilities of said first and second memory sub-groups;
    reading a first one of said first and second data during a fourth time period subsequent to said third time period;
    reading a second one of said first and second data during a fifth time period subsequent to said fourth time period; and
    comparing said first and second ones of read data to expected results to determine said data retention capabilities of said first and second memory sub-groups.

2. The method as recited in claim 1 wherein said first and second data are written in a checkerboard pattern.

3. The method as recited in claim 1 further comprising:
    writing third data to said first memory sub-group during a sixth time period subsequent to said fifth time period;
    writing fourth data to said second memory sub-group during a seventh time period subsequent to said sixth time period;
    pausing during an eighth time period subsequent to said seventh time period if the total time required to write said third data to said first memory sub-group and said fourth data to said second memory sub-group is insufficient to further determine said data retention capabilities of said first and second memory sub-groups;
    reading a first one of said third and fourth data during a ninth time period subsequent to said eighth time period;
    reading a second one of said third and fourth data during a tenth time period subsequent to said ninth time period; and
    comparing said first and second ones of read third and fourth data to expected results to further determine said data retention capabilities of said first and second memory sub-groups.

4. The method as recited in claim 3 wherein said first and second data are written in a first pattern and said third and fourth data are written in a second pattern different from said first pattern.

5. The method as recited in claim 4 wherein said second pattern is an inverse of said first pattern.

6. The method as recited in claim 4 wherein said first pattern is a checkerboard pattern and said second pattern is an inverse checkerboard pattern.

7. A system for testing data retention of memory, comprising:
    a plurality of memory controllers each associated with and configured to access at least one memory sub-group;
    a test controller configured to enable said memory controllers to:
        write to said associated memory sub-groups during a plurality of first time periods that are each distinct to one of said memory controllers,
        pause for a predetermined time interval during a second time period that is subsequent to said first time periods if the total time required to write to said memory sub-groups during said plurality of first time periods is insufficient to determine data retention capabilities of said memory sub-groups, and
        read from said associated memory sub-groups during a plurality of third time periods that are each distinct to one of said memory controllers and subsequent to said second time period; and
    a comparison device configured to compare data read from said memory sub-groups to expected results to determine said data retention capabilities of said memory sub-groups.

8. The system as recited in claim 7 wherein said plurality of memory controllers includes a plurality of built-in self-test (BIST) controllers.

9. The system as recited in claim 7 wherein said plurality of memory controllers includes dedicated memory controllers each associated with and configured to access one of said memory sub-groups.

10. The system as recited in claim 7 wherein said plurality of memory controllers includes shared memory controllers each associated with and configured to access at least two of said memory sub-groups.

11. The system as recited in claim 7 wherein said test controller includes a test access port (TAP) controller.

12. The system as recited in claim 7 wherein said test controller is configured to enable said memory controllers to write data to said associated memory sub-groups in a predetermined pattern.

13. The system as recited in claim 12 wherein said pattern is a checkerboard pattern.

14. The system as recited in claim 7 wherein said test controller is configured to enable said memory controllers to write data to said associated memory sub-groups in a first pattern during said first time periods and in a second pattern during a plurality of fourth time periods that are each distinct to one of said memory controllers and subsequent to said third time periods.

15. The system as recited in claim 14 wherein said second pattern is an inverse of said first pattern.

16. The system as recited in claim 15 wherein said first pattern is a checkerboard pattern and said second pattern is an inverse checkerboard pattern.

17. The system as recited in claim 7 wherein said system and said memory sub-groups are integral to a common chip.

18. A system for testing data retention of memory, comprising:
    means for accessing sub-groups of memory;
    means for controlling said accessing means to:
        write data to said memory sub-groups during a plurality of distinct first time periods,
        pause for a predetermined time interval during a second time period that is subsequent to said first time periods if the total time required to write data to said memory sub-groups is insufficient to determine data retention capabilities of said memory sub-groups, and
        read data from said memory sub-groups during a plurality of distinct third time periods that are subsequent to said second time period; and means for comparing said read data to expected results to determine said data retention capabilities of said memory sub-groups.

19. The system as recited in claim 18 wherein said accessing means include dedicated accessing means configured to access one of said memory sub-groups.

20. The system as recited in claim 18 wherein said accessing means include shared accessing means configured to access at least two of said memory sub-groups.

21. The system as recited in claim 18 wherein said controlling means are configured to enable said accessing means to write data to said memory sub-groups in a predetermined pattern.

22. The system as recited in claim 21 wherein said pattern is a checkerboard pattern.

23. The system as recited in claim 18 wherein said controlling means are configured to enable said accessing means to write data to said memory sub-groups in a first pattern during said first time periods and in a second pattern during a plurality of distinct fourth time periods that are subsequent to said third time periods.

24. The system as recited in claim 23 wherein said second pattern is an inverse of said first pattern.

25. The system as recited in claim 18 wherein said system and said memory sub-groups are integral to a common chip.

* * * * *